United States Patent
Cong et al.

(10) Patent No.: US 10,777,378 B2
(45) Date of Patent: Sep. 15, 2020

(54) TRANSMISSION ELECTRON MICROSCOPE MICRO-GRID AND METHOD FOR MAKING THE SAME

(71) Applicants: Tsinghua University, Beijing (CN); HON HAI PRECISION INDUSTRY CO., LTD., New Taipei (TW)

(72) Inventors: Lin Cong, Beijing (CN); Wei Zhao, Beijing (CN); Jin Zhang, Beijing (CN); Yu-Chien Tsai, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/252,702

(22) Filed: Jan. 20, 2019

(65) Prior Publication Data

US 2019/0237294 A1   Aug. 1, 2019

(30) Foreign Application Priority Data

Jan. 27, 2018   (CN) .......................... 2018 1 0080253

(51) Int. Cl.
*H01J 37/20* (2006.01)
*H01J 37/285* (2006.01)

(52) U.S. Cl.
CPC ............ *H01J 37/20* (2013.01); *H01J 37/285* (2013.01)

(58) Field of Classification Search
USPC .................................................. 250/440.11
See application file for complete search history.

(56) References Cited

U.S. PATENT DOCUMENTS

| | | | |
|---|---|---|---|
| 8,377,243 B2 * | 2/2013 | Golzhauser | B05D 1/283 156/230 |
| 8,772,736 B2 * | 7/2014 | Feng | H01J 37/26 228/136 |
| 2012/0006784 A1 | 1/2012 | Lin et al. | |
| 2012/0258275 A1 | 10/2012 | Maeno | |
| 2012/0298289 A1 | 11/2012 | Jiang et al. | |
| 2016/0042912 A1 | 2/2016 | Adiga et al. | |

FOREIGN PATENT DOCUMENTS

| | | |
|---|---|---|
| CN | 102315058 | 1/2012 |
| CN | 206163454 | 5/2017 |
| CN | 206163454 U | 5/2017 |
| JP | 2011-132074 | 7/2011 |
| TW | I427000 | 2/2014 |
| TW | I520901 | 2/2016 |
| WO | 2014/064057 | 5/2014 |

* cited by examiner

*Primary Examiner* — Phillip A Johnston
(74) *Attorney, Agent, or Firm* — ScienBiziP, P.C.

(57) ABSTRACT

The present invention relates to a transmission electron microscope (TEM) micro-grid and a method for preparing the TEM micro-grid. The TEM micro-grid comprises a porous silicon nitride substrate and a graphene layer located on a surface of the porous silicon nitride substrate. The porous silicon nitride substrate comprises a plurality of through holes. The graphene layer covers the plurality of through holes. The method for preparing the TEM micro-grid provided in the present disclosure uses a carbon nanotube film structure to transfer a graphene layer to a surface of a porous silicon nitride substrate.

20 Claims, 10 Drawing Sheets

A—front view

B—side view

TRANSMISSION ELECTRON MICROSCOPE MICRO-GRID AND METHOD FOR MAKING THE SAME

CROSS-REFERENCE TO RELATED APPLICATIONS

This application claims all benefits accruing under 35 U.S.C. § 119 from China Patent Application No. 201810080253.2, filed on Jan. 27, 2018, in the China National Intellectual Property Administration, the contents of which are hereby incorporated by reference. This application is related to applications entitled, "METHOD FOR TRANSFERRING TWO-DIMENSIONAL NANOMATERIALS", filed Jan. 20, 2019 (Ser. No. 16/252,700), "METHOD FOR PREPARING SUSPENDED TWO-DIMENSIONAL NANOMATERIALS", filed Jan. 20, 2019 (Ser. No. 16/252,701), "METHOD FOR TRANSFERRING TWO-DIMENSIONAL NANOMATERIALS", filed Jan. 20, 2019 (Ser. No. 16/252,703).

FIELD

The present disclosure relates to a transmission electron microscope micro-grid and a method for making the transmission electron microscope micro-grid.

BACKGROUND

Transmission electron microscopy is one of the most important techniques for the detailed examination and analysis of materials having small size. Transmission electron microscopy provides high-resolution imaging and material analysis of thin specimens. In transmission electron microscopy analysis, a transmission electron microscope (TEM) micro-grid is used to support the specimens. The conventional TEM micro-grid includes a metal micro-grid such as a copper or nickel micro-grid, a porous organic membrane covering on the metal grid, and an amorphous carbon film deposited on the porous organic membrane. However, in practical application, when a size of the specimen is less than a thickness of the supporting film, the amorphous carbon film induces high noise in the transmission electron microscopy imaging.

What is needed, therefore, is to provide a TEM micro-grid and a method for making the TEM micro-grid, to overcome the above-described shortcomings.

BRIEF DESCRIPTION OF THE DRAWINGS

Many aspects of the exemplary embodiments can be better understood with reference to the following drawings. The components in the drawings are not necessarily drawn to scale, the emphasis instead being placed upon clearly illustrating the principles of the exemplary embodiments. Moreover, in the drawings, like reference numerals designate corresponding parts throughout the several views.

DETAILED DESCRIPTION

Figure 1:
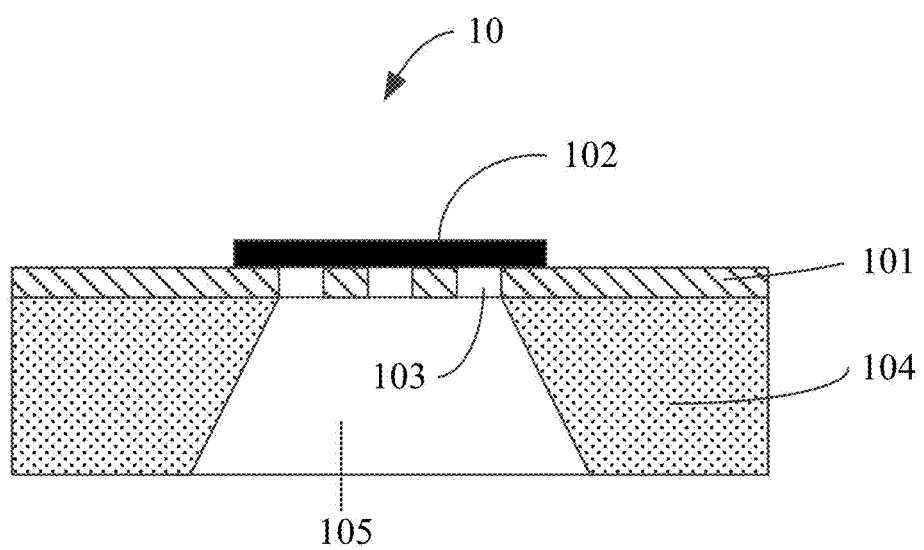
FIG. 1 shows a schematic view of a TEM micro-grid according to one embedment.

The disclosure is illustrated by way of embodiments and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "include," when utilized, means "include, but not necessarily limited to"; it specifically indicates open-ended inclusion or membership in the so-described combination, group, series, and the like.

Referring to FIG. 1, a TEM micro-grid 10 is provided according to one embodiment. The TEM micro-grid 10 comprises a porous silicon nitride substrate 101 and a graphene layer 102. The graphene layer 102 is located on a surface of the porous silicon nitride substrate 101. The porous silicon nitride substrate 101 defines a plurality of through holes 103. The graphene layer 102 covers the plurality of through holes 103, and a part of the graphene layer 102 is suspended over the plurality of through holes 103.

A thickness of the porous silicon nitride substrate 101 ranges from about 50 nanometers to about 100 nanometers. Cross-sectional shapes of the through holes 103 can be circles, quadrangles, hexagons, octagons or ellipses, etc. Diameters of the through holes 103 range from about 0.1 microns to about 100 microns, and in one embodiment, the diameters of the through holes 103 range from about 0.5 microns to about 50 microns.

The graphene layer 102 is used as a supporting film to carry a specimen. The graphene layer 102 can be a continuous integrated structure. The term "continuous integrated structure" is defined as a structure that is combined by chemical bonds (e.g., $sp^2$ bonds, $sp^1$ bonds, or $sp^3$ bonds) to form an overall structure. The graphene layer 102 can comprise a single layer of graphene or a plurality of layers of graphene. If the graphene layer 102 includes a plurality of layers of graphene, the plurality of layers of graphene are stacked with each other. In one embodiment, the graphene layer 102 comprises one to three layers of graphene, thus the TEM micro-grid 10 can have a better contrast.

The TEM micro-grid 10 further comprises a supporting substrate 104. The supporting substrate 104 is used to support and protect the porous silicon nitride substrate 101. The porous silicon nitride substrate 101 is placed on a surface of the supporting substrate 104. The supporting substrate comprises a window 105. The window 105 is a big hole and extends through the supporting substrate along a thickness direction of the supporting substrate. The plurality of through holes 101 of the porous silicon nitride substrate 103 is placed above the window 105 of the silicon substrate 104. The supporting substrate 104 can be a silicon substrate. The thickness of the supporting substrate 104 ranges from about 100 to 500 micrometers. A cross-sectional shape of the window 105 is not limited and can be square or circle. A size of the window ranges from about 20 to 100 micrometers.

The TEM micro-grid provided by the present disclosure has the following characteristics.

Firstly, the supporting film of the TEM micro-grid is the graphene layer 102. The graphene layer 102 is very thin. The thickness of a single-layer graphene is about 0.335 nanometers. Thus the background noise cause by the supporting film during the TEM observation can be lowered, and the TEM image can obtain a higher resolution.

Secondly, the graphene layer is a continuous integrated structure. The surface of the graphene layer is flat. There is no observable gap on the surface of the graphene layer. All above can be beneficial to the observation of the specimen.

Thirdly, compared with conventional metal grids, the porous silicon nitride substrate 101 has a higher melting point, a stronger chemical inertness, and a higher strength. Therefore, the porous silicon nitride substrate 101 can be applied to transmission electron microscope observation experiments under various conditions.

Figure 2:
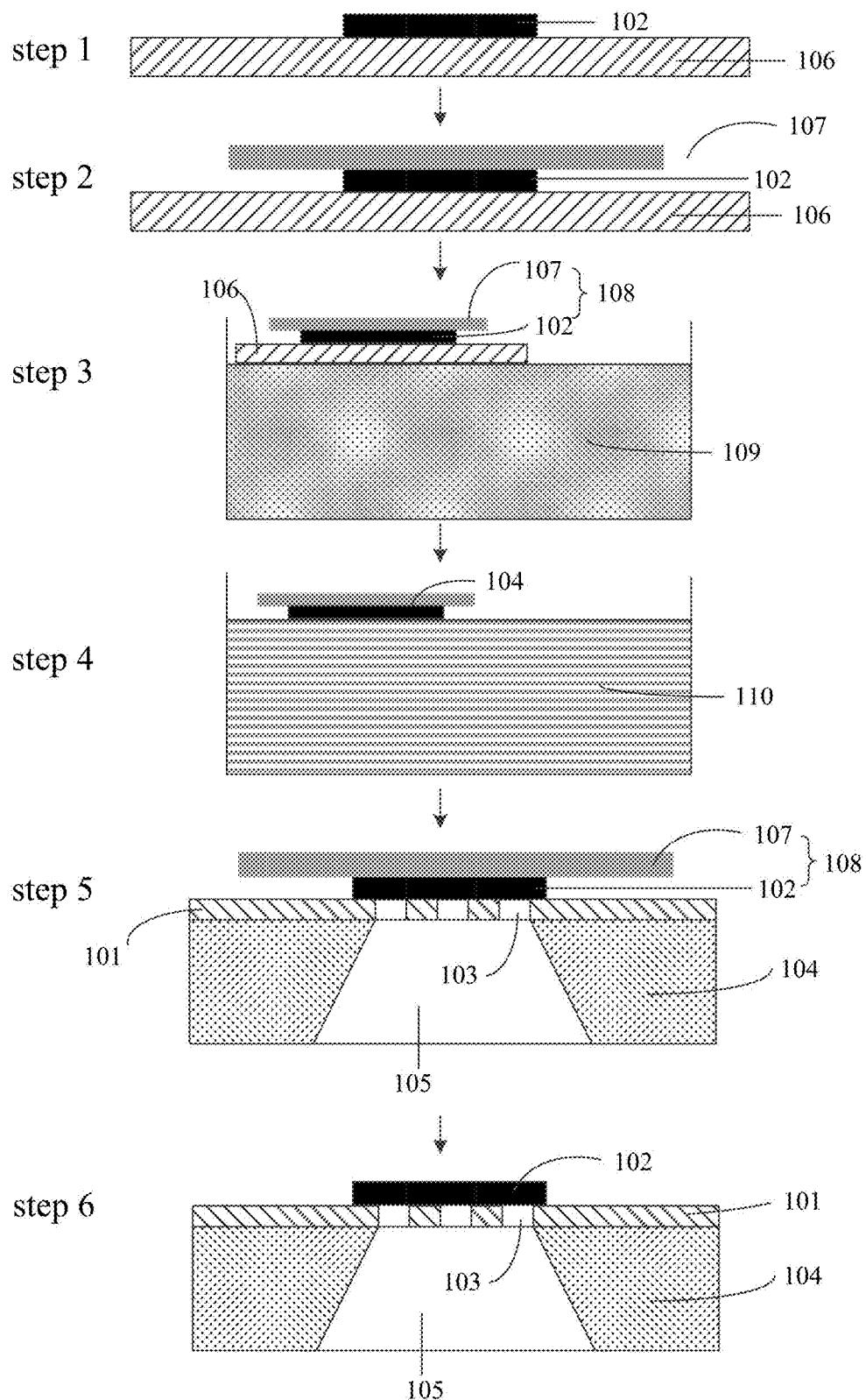
FIG. 2 shows a flow chart of a method for making a TEM micro-grid according to one embodiment.

Referring to FIG. 2, a method for preparing the TEM micro-grid 10 according to one embodiment, comprises the following steps:

S1, providing a first substrate 106 with a graphene layer 102 located on a surface of the first substrate 106;

S2, covering the graphene layer 102 with a carbon nanotube film structure 107;

S3, obtaining a composite structure 108 comprising the graphene layer102 and the carbon nanotube film structure 107 by removing the first substrate 106 with a corrosion solution 109;

S4, placing the composite structure 108 on a surface of a cleaning solution 110 for cleaning;

S5, providing a porous silicon nitride substrate 101 comprising at least one through hole 103, and picking up the composite structure 108 from the cleaning solution 110 with the porous silicon nitride substrate 101 by contacting the porous silicon nitride substrate 101 with the graphene layer 102 of the composite structure 108 and covering the at least one through hole 103 with the graphene layer 102;

S6, removing the carbon nanotube film structure 107 from the composite structure 108.

The step S1~S6 are described in detail as followings.

In the step S1, a first substrate 106 is provided and a graphene layer 102 is placed on a surface of the first substrate 106.

The first substrate 106 serves as a support for the graphene. The substrate 101 is structurally stable and can be removed by chemical methods or physical methods. A material of the first substrate 106 can be a semiconductor material or a metal material according to different applications. In one embodiment, the substrate can be a silicon wafer, a copper foil, a nickel foil or a copper-nickel alloy.

The graphene layer 102 can be formed on the surface of the first substrate 106 via a chemical vapor deposition method. A layer number of the graphene layer 102 is not limited. The layer number of the graphene layer 102 can be one layer, two layers or multiple layers.

Figure 3:
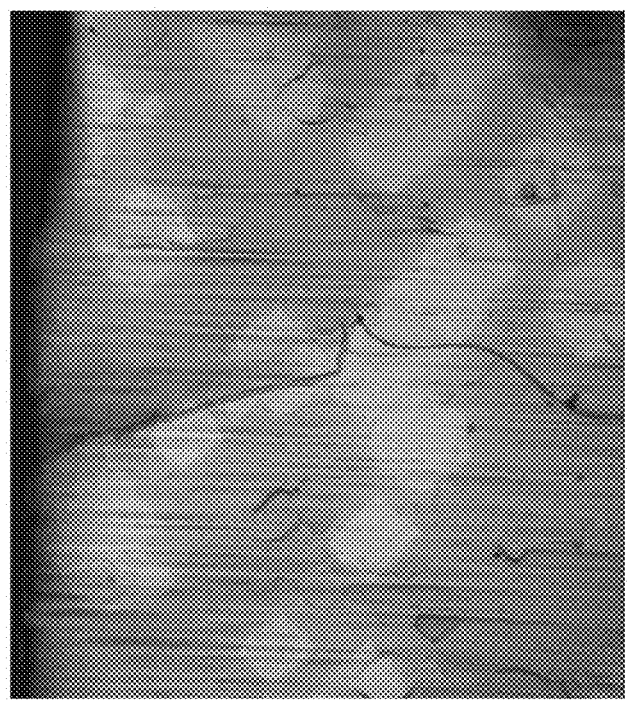
FIG. 3 shows an Optical Microscope image of a single-layer graphene grown on a surface of a copper foil according to one embodiment.

In one embodiment, the first substrate 106 is a copper foil, and the graphene layer is a single-layer graphene directly grown on a surface of the copper foil. Referring to FIG. 3, an Optical Microscope image of the single-layer graphene grown on the surface of the copper foil is provided.

In the step S2, the graphene layer 102 is covered with a carbon nanotube film structure 107.

The carbon nanotube film structure 107 is a free-standing structure. The carbon nanotube film structure 107 consists of at least two carbon nanotube films stacked with each other. Understandably, the more layers of the carbon nanotube film, the weaker the light transmittance and the lower the transparency of the carbon nanotube film structure 107. In one embodiment, the carbon nanotube film structure 107 consists of two stacked carbon nanotube films. The carbon nanotube film comprises a plurality of carbon nanotubes joined end-to-end by van der Waals force therebetween and arranged approximately along a same direction. An extending direction of each carbon nanotubes is substantially parallel to a surface of the carbon nanotube film. Within the carbon nanotube film structure, an angle between the extending directions of the carbon nanotubes in the two adjacent carbon nanotube films can range from about 0 degrees to about 90 degrees ($0° \leq \alpha \leq 90°$).

The carbon nanotube film can be drawn directly from a carbon nanotube array, which comprises the following steps:

S21, providing a super-aligned carbon nanotube array grown on a surface of a growth substrate.

The carbon nanotube array can be formed by a chemical vapor deposition (CVD) method. The carbon nanotube array comprises a plurality of carbon nanotubes parallel to each other and approximately perpendicular to the growth substrate. The carbon nanotube array contains no impurities substantially such as amorphous carbon or residual catalyst metal particles, and is suitable for drawing a carbon nanotube film therefrom.

S22, pulling/drawing out a carbon nanotube film from the carbon nanotube array with a tool.

The step S22 comprises the following steps:

S221, selecting a carbon nanotube segment having a predetermined width from the carbon nanotube array; and S222, pulling the carbon nanotube segment at an even and uniform speed to obtain the uniform drawn carbon nanotube film.

In step S221, the carbon nanotube segment having a predetermined width can be selected by using an adhesive tape having a predetermined width to contact the carbon nanotube array. The carbon nanotube segment comprises a plurality of carbon nanotubes parallel to each other. In step S222, the pulling direction is substantially perpendicular to a growth direction of the carbon nanotube array.

Figure 4:
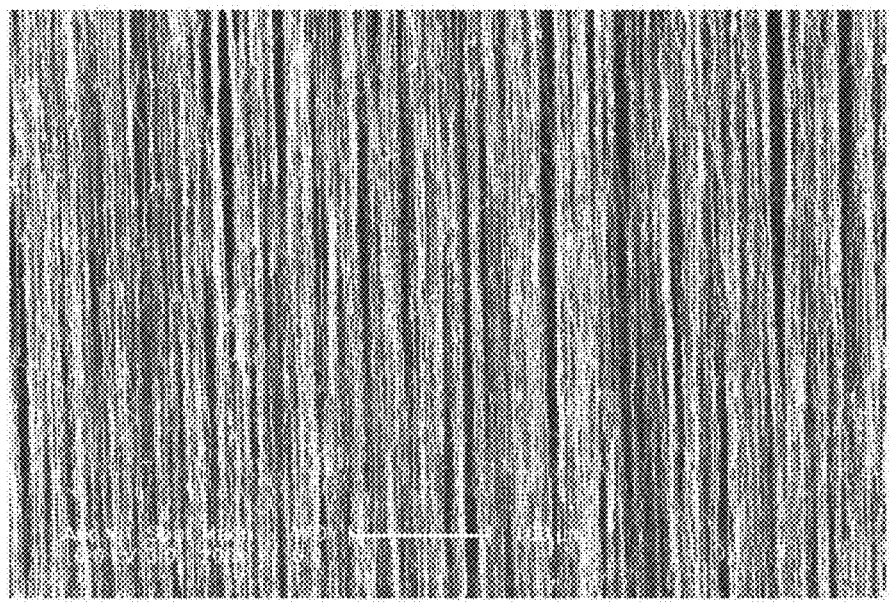
FIG. 4 shows a Scanning Electron Microscope (SEM) image of a carbon nanotube film.

More specifically, during the pulling process, as the initial carbon nanotube segment is drawn out, other carbon nanotube segments are subsequently drawn out end-to-end due to the van der Waals force between the ends of the adjacent segments. This process of drawing ensures that a continuous, uniform carbon nanotube film having a predetermined width can be formed. Referring to FIG. 4, the carbon nanotubes in the carbon nanotube film are joined end-to-end by van der Waals force therebetween to form a free-standing film. 'Free-standing' herein is defined so that the carbon nanotube film does not need support from a substrate and can sustain its own weight when it is hoisted by a portion thereof without tearing. The carbon nanotube film comprises a plurality of carbon nanotubes joined end-to-end by van der Waals force therebetween and arranged approximately along a same direction. The plurality of carbon nanotubes are arranged approximately along the drawing direction.

Figure 5:
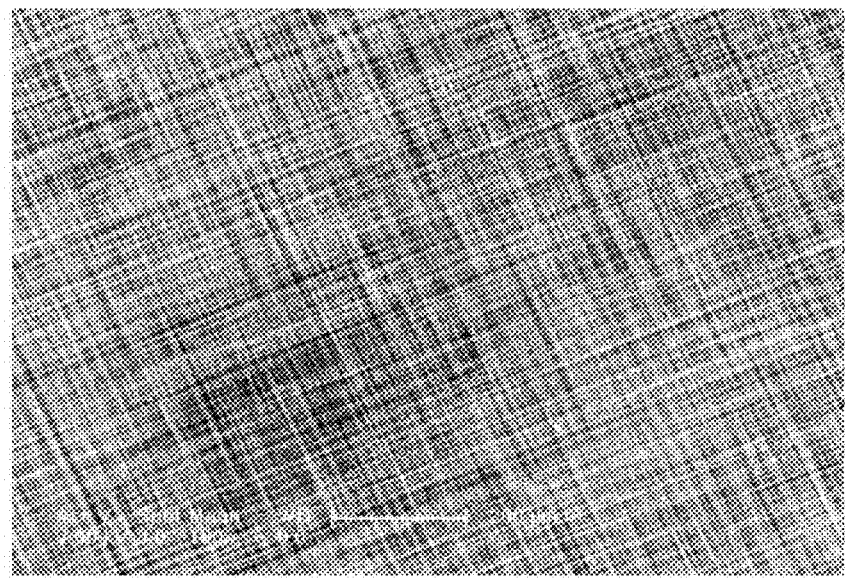
FIG. 5 shows an SEM image of a carbon nanotube film structure comprising a plurality of stacked carbon nanotube films.

Referring to FIG. 5, then, at least two carbon nanotube films are stacked with each other along different directions, and the carbon nanotube film structure 107 is formed. The process above specifically comprises: providing a frame and securing a first carbon nanotube film to the frame along a first direction, wherein one or more edges of the carbon nanotube film are attached to the frame and other parts of the carbon nanotube film are suspended over the frame; placing a second carbon nanotube film on a surface of the first carbon nanotube film along a second direction. More carbon nanotube films can be stacked with each other on the frame by repeating the above process. The carbon nanotube films can be respectively arranged along different directions, and can also be arranged along two directions.

The carbon nanotube film has an extremely large specific surface area, and is very self-adhesive, so adjacent carbon nanotube films can be combined with the van der Waals force therebetween to form a stable carbon nanotube film structure.

The carbon nanotube film structure 107 is placed on a surface of the graphene layer 102 away from the first substrate 106. The carbon nanotube film structure 107 can adhere to the graphene layer 102 firmly by van der Waals force to form a first substrate/graphene layer/carbon nanotube film composite structure.

Step S2 can further comprise an optional step of treating the carbon nanotube film structure 107 on the graphene layer 102 of the first substrate 106 with an organic solvent. The organic solvent can be volatile at room temperature and can be ethanol, methanol, acetone, dichloroethane, chloroform, or any combination thereof. The step of treating the carbon nanotube film structure 107 with the organic solvent comprises: dropping the organic solvent on a surface of the carbon nanotube film structure 107 uniformly and infiltrating the whole carbon nanotube film structure 107 with the organic solvent, or, alternatively, immersing the entire carbon nanotube film structure 107 on the graphene layer 102 of the first substrate 106 into a container containing the organic solvent.

The organic solvent can be evaporated from the surface of the carbon nanotube film structure 107. Thereby pores between adjacent carbon nanotubes in the carbon nanotube film structure 107 can be enlarged, and the carbon nanotube film structure 107 can adhere to the graphene layer 102 more firmly by the surface tension of the solvent, in addition to the self-adhering van der Waals force.

Figure 6:
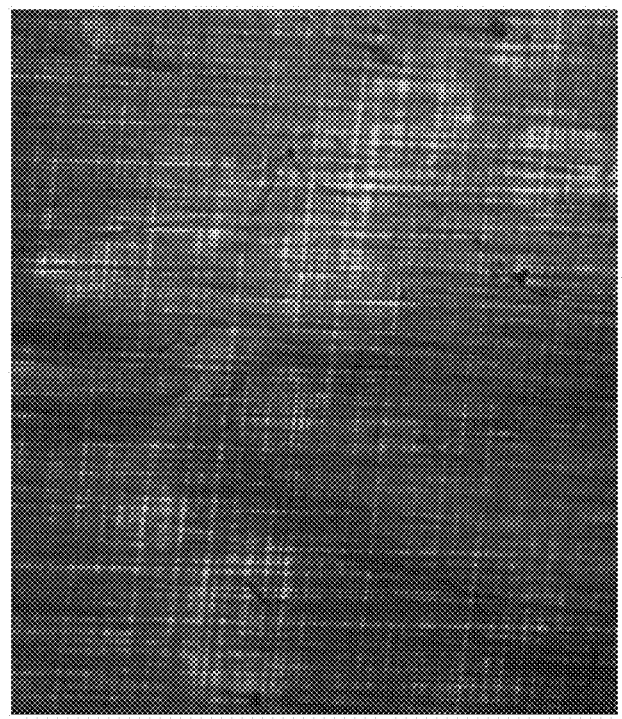
FIG. 6 shows an Optical Microscope image of a composite structure formed by covering a single-layer graphene grown on a surface of a copper foil with a carbon nanotube film structure according to one embodiment.

In one embodiment, the carbon nanotube film structure comprises two carbon nanotube films stacked with each other. An angle formed by the extending direction of the carbon nanotubes in the two adjacent carbon nanotube films is 90 degrees. The carbon nanotube film structure 107 is placed on a surface of the single-layer graphene grown on the surface of the copper foil. Then, the ethanol is dropped on a surface of the carbon nanotube film structure 107 to increase a bonding force between the carbon nanotube film structure 107 and the single-layer graphene by an effect of a surface tension of the ethanol. FIG. 6 shows an Optical Microscope image of the composite structure formed by covering the single-layer graphene grown on the surface of the copper foil with the carbon nanotube film structure. Referring to FIG. 6, the carbon nanotube film structure is of certain transparency, and thus the single-layer graphene can be observed through the carbon nanotube film structure.

In the step S3, the first substrate 106 is removed with a corrosion solution 109, thus a composite structure 108 comprising the graphene layer 102 and the carbon nanotube film 107 can be obtained.

The first substrate/graphene layer/carbon nanotube film structure composite structure is placed on a surface of a corrosion solution filled in a container. The first substrate 106 is in contact with the corrosion solution. The corrosion solution can react with the first substrate 106 and will not erode the graphene layer 102 and the carbon nanotube film structure 107. Thus, after reacting with the corrosion solution for a period of time, the first substrate 106 can be removed.

Different corrosion solution can be selected according to the material of the first substrate 106. The corrosion solution 109 can be an acid solution, an alkali solution, or a salt solution. For example, the corrosion solution 109 can be a ferric chloride solution, an ammonium persulfate solution, or a potassium hydroxide solution. A corroding time required for the first substrate 106 depends on a size and a thickness of the first substrate 106 and a concentration and a type of the corrosion solution. In one embodiment, the corrosion solution 109 is the ammonium persulfate solution, the concentration of the ammonium persulfate solution is 0.1 mol/L, and the corroding time is about 2 hours to 3 hours.

During the corroding process, the carbon nanotube film structure 107 can float on the surface of the corrosion solution 109 because carbon nanotube films are hydrophobic. The graphene layer 102 can adhere to the surface of the carbon nanotube film structure 107 tightly via the van der Waals force therebetween. Moreover, as a free-standing structure, the carbon nanotube film structure 107 can act as a carrier for supporting the graphene layer 102, and can also prevent the continuous integrated structure of the graphene layer 102 from disintegrating.

In the step S4, the composite structure 108 comprising the graphene layer 102 and the carbon nanotube film structure 107 is placed on a surface of a cleaning solution 110 for cleaning.

In the corroding process of the step S3, solid impurities can be formed on a surface of the graphene layer 102. Then, the composite structure 108 comprising the graphene layer 102 and the carbon nanotube film structure 107 can be further cleaned by a cleaning solution 110 to remove the solid impurities. In one embodiment, the cleaning process comprises the followings steps:

S41, picking the composite structure 108 up from the corrosion solution 109 with a slide glass;

S42, transferring the composite structure 108 to the surface of the cleaning solution 110 with the slide glass and rinsing off the solid impurities.

The steps above can be repeated many times until the solid impurities are removed completely. The cleaning solution 110 can be an acid solution or an ultra-pure water. In one embodiment, the cleaning solution 110 is the ultra-pure water.

In the step S5, a porous silicon nitride substrate 101 comprising at least one through hole 103 is provided and the composite structure 108 is picked up from the cleaning solution 110 via the porous silicon nitride substrate 101, wherein the graphene layer 102 is in contact with the porous silicon nitride substrate 101 and covers the plurality of the through holes 103.

The porous silicon nitride substrate 101 serves as a support for the graphene layer 102. The thickness of the porous silicon nitride substrate 101 ranges from about 50 nanometers to about 200 nanometers. In one embodiment, a surface of the porous silicon nitride substrate is a flat surface, and the thickness of the porous silicon nitride substrate is about 100 nanometers.

The through holes 103 can be formed by etching the porous silicon nitride substrate 101. Cross-sectional shapes of the through holes 103 are not limited and can be circles, quadrangles, hexagons, octagons or ellipses etc. Diameters of the through holes 103 range from about 0.1 microns to about 100 microns, and in one embodiment, the diameter of each of the through holes is about 2 micrometers. A distance between adjacent through holes 105 can be equal or unequal. In one embodiment, the plurality of the through holes 105 are evenly distributed in the porous silicon nitride substrate 101.

The porous silicon nitride substrate 101 is placed on a surface of a supporting substrate 104. The supporting substrate 104 is used to support and protect the porous silicon nitride substrate 101. The supporting substrate 104 comprises a window 105. The plurality of through holes 103 of the porous silicon nitride substrate 101 is placed above the window 105 of the supporting substrate 104. The supporting substrate 104 can be a silicon substrate. A thickness of the silicon substrate ranges from about 100 to 500 micrometers. A cross-sectional shape of the window 105 is not limited and can be a square or a round. A size of the window ranges from about 20 to 100 micrometers.

In one embodiment, the process of picking up the composite structure 108 from the cleaning solution 110 with the porous silicon nitride substrate 101 comprises: S51, inserting the porous silicon nitride substrate 101 into the cleaning solution 110; S52, lifting the porous silicon nitride substrate 101 slowly to pick up the composite structure 108.

Figure 7:
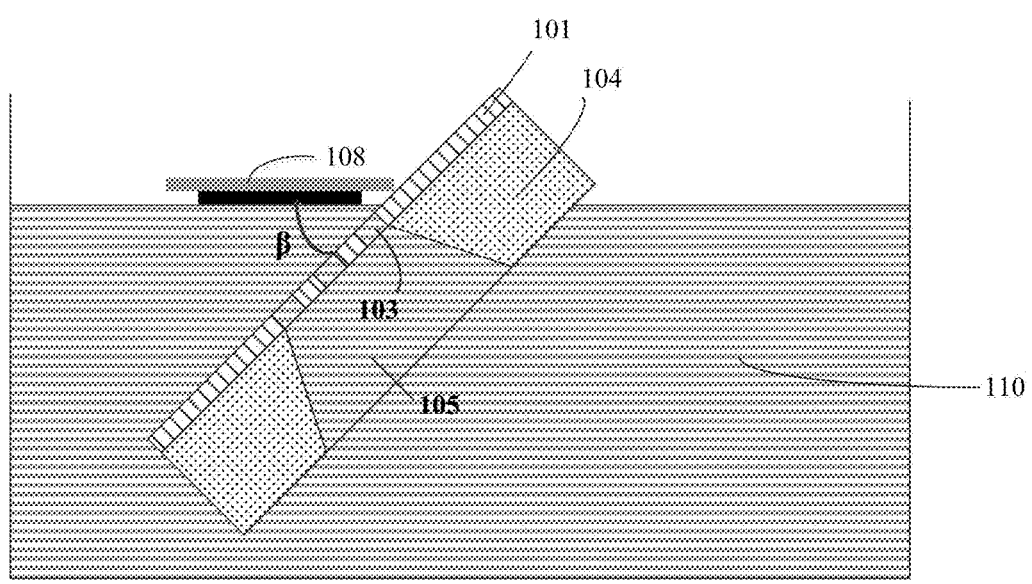
FIG. 7 shows a schematic view of inserting a porous silicon nitride substrate into a cleaning solution to picking up a composite structure comprising a graphene layer and a carbon nanotube film structure.

Referring to FIG. 7, in the step S51, a manner of inserting the porous silicon nitride substrate 101 into the cleaning solution 110 is not limited. In one embodiment, the porous silicon nitride substrate 101 can be obliquely or vertically inserted into the cleaning solution along one edge of the composite structure 108, and a surface of the porous silicon nitride substrate 101 is in contact with an edge of the composite structure 108. 'Obliquely' implies that an angle β can be defined between the porous silicon nitride substrate 101 and the composite structure 108. The angle β can range from about 0 degree to about 90 degrees. 'Vertically' implies that the porous silicon nitride substrate 101 is vertical to the composite structure 108 and the angle β is 90 degrees. In another embodiment, the porous silicon nitride substrate 101 is inserted into the cleaning solution 110 and substantially parallel to the composite structure 108 in the cleaning solution 110, and the angle β is 0 degrees.

In the step S52, the porous silicon nitride substrate 101 is lift slowly. During the process of lifting the porous silicon nitride substrate 101, a surface of the porous silicon nitride substrate 101 is in contact with and adhere to the graphene layer 102 and the composite structure 108 is picked up from the cleaning solution 110. Thus, the graphene layer 102 is sandwiched between the carbon nanotube film structure 107 and the porous silicon nitride substrate 101.

After being picked up, the porous silicon nitride substrate 101 and the composite structure 108 can be dried. Thereby, the graphene layer 102 can adhere to the porous silicon nitride substrate 101 tightly.

In the present disclosure, the composite structure is picked up from the cleaning solution with the porous silicon nitride substrate 101, and then transferred on the surface of the porous silicon nitride substrate 101. Thereby, wrinkles and cracks on the surface of the graphene layer 102 can be reduced, and a bonding force between the graphene 102 and the porous silicon nitride substrate 101 can be enhanced.

The carbon nanotube film structure 107 comprises a plurality of micropores, therefore it is light transmitting and transparent. The graphene layer 102 can be observed through the carbon nanotube film structure 107 under a stereo microscope. The at least one through hole 103 of the porous silicon nitride substrate 101 can be precisely aligned with the graphene layer 102 of the composite structure in the cleaning solution in advance, and then the composite structure 108 is picked up from the cleaning solution 110 with the porous silicon nitride substrate 103. The graphene layer 102 can cover the at least one through hole 103 of the porous silicon nitride substrate 101 with precision. Thereby a site-directed transfer of the graphene layer 102 can be realized.

In the step S6, the carbon nanotube film structure 107 is removed. The graphene layer 102 is left on the surface of the porous silicon nitride substrate 101. Thus the TEM microgrid 10 can be obtained.

A method for removing the carbon nanotube film structure 107 is not limited. Two methods for removing the carbon nanotube film structure 107 are provided in the following disclosure.

A first method, in which a polymer film 111 is used to remove the carbon nanotube film structure 107, comprises steps of:

Step (1), placing a polymer film 111 on a surface of the carbon nanotube film structure 107 away from the porous silicon nitride substrate 101.

Figure 8:
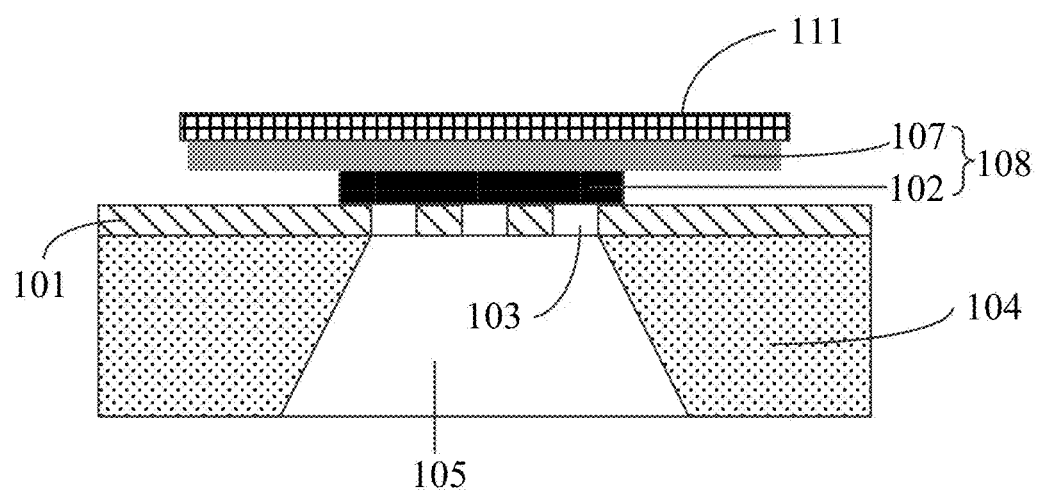
FIG. 8 shows a schematic view of placing a polymer film on a surface of a carbon nanotube film structure.

Referring to FIG. 8, the carbon nanotube film structure 107 is covered by the polymer film 111. The polymer film 111 can be selected from materials whose crosslinking degree become high when treated via heating or irradiation. In one embodiment, the material of the polymer film 111 can be a thermosetting material such as polymethylsiloxane (PDMS) or polybutyl acrylate (PBA). In one embodiment, the carbon nanotube film structure 107 is completely covered with the polymer film 111.

Step (2), treating the polymer film 111 by heating or by irradiation to increase its crosslinking degree.

The polymer film 111 is treated such that the carbon nanotube film structure 107 and the polymer film 111 are torn off from the graphene layer 102 together. In one embodiment, the polymer film is heated at a temperature for a period of time to increase its crosslinking degree. The heating temperature and the heating time depend on the material of the polymer film. For example, when the polymer film is a PDMS film, it is heated at 150 degrees Celsius for 20 minutes to 40 minutes. After bring heated, the polymer film 111 has a high crosslinking degree. The polymer film 111 becomes harder than before and is easily torn off. The polymer film 111 can only adhere with the carbon nanotube film structure 107. In addition, a binding force between the polymer film 111 and the carbon nanotube film structure 107 is greater than that between the graphene layer 102 and the carbon nanotube film structure 107, so the carbon nanotube film structures 103 can be torn off with the polymer film 111.

Step (3), tearing off the polymer film 111 from the graphene layer 102.

The polymer film 111 can be torn off by clamping a side of the polymer film 111 with a tool such as a tweezers, and the carbon nanotube film structure 107 is torn off with the polymer film 111, leaving the graphene layer 102 on the surface of the porous silicon nitride substrate 101.

A second method, in which at least one strip is used to remove the carbon nanotube structure 103, comprises steps of:

Step (A), when the carbon nanotube film structure 107 consists of n-layer carbon nanotube films stacked with each other, wherein n is an integer greater than or equals to two, a first layer carbon nanotube film to a n−1th layer carbon nanotube film of the carbon nanotube film structure 107 are sequentially torn off along the extending direction of carbon nanotubes of the carbon nanotube film, wherein the first layer carbon nanotube film is farthest away from the graphene layer 102.

The first layer carbon nanotube film to the n−1th layer carbon nanotube film of the carbon nanotube film structure 107 can be torn off by a tool such as a tweeze, leaving an nth layer carbon nanotube film of the carbon nanotube film structure 107 on the surface of the graphene layer 102.

Step (B), at least one strip 112 is provided, and placed on a surface of a nth layer carbon nanotube film away from the graphene layer 102, wherein, the strip 112 is placed at one side of the nth layer carbon nanotube film, the strip 112 does not cover the graphene layer 102, and an extending direction of the strip is substantially perpendicular to the extending direction of carbon nanotubes of the nth layer carbon nanotube film.

Figure 9:
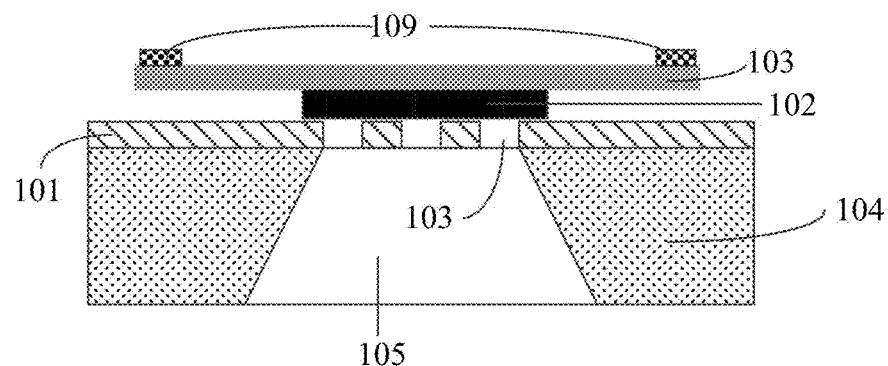
FIG. 9 shows a front view and a side view of placing at least one strip on a surface of an nth layer carbon nanotube film of a carbon nanotube film structure.
Figure 9:
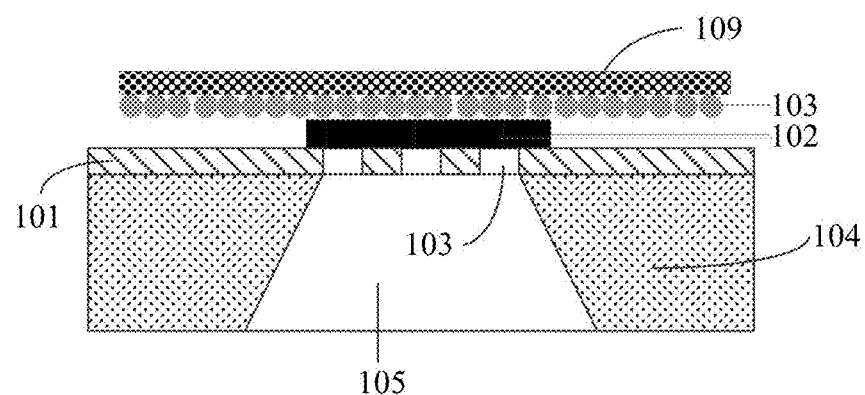

Referring to FIG. 9, at least one strip 112 is placed on a surface of the nth layer carbon nanotube film of the carbon nanotube film structure 107. A shape of the strip 112 can be regular or irregular. In one embodiment, the shape of the strip 112 is a rectangle. The rectangle strip comprises a long side and a short side, wherein the long side is substantially perpendicular to the carbon nanotubes of the nth layer carbon nanotube film. In another embodiment, at least two strips are provided. The at least two strips are placed at two opposite sides of the nth layer carbon nanotube film. The strip has a certain viscosity and thus can adhere to the nth layer carbon nanotube film. The strip 112 can be a polymer film or an adhesive tape.

Step (C), the nth layer nanotube film is torn off from the graphene layer 102, as the strip 112 is being torn off along the extending directions of carbon nanotubes of the nth layer carbon nanotube film.

The nth layer of carbon nanotube film is a continuous film, so it can be torn off as the strip 112 is being torn off, and the graphene layer is completely left adhered to the surface of the porous silicon nitride substrate 101.

By the two methods as disclosed above, the carbon nanotube film structure 107 can be completely removed. The graphene layer 102 sustains no damages, and no residue is left on the surface of the graphene layer 102.

Figure 10:
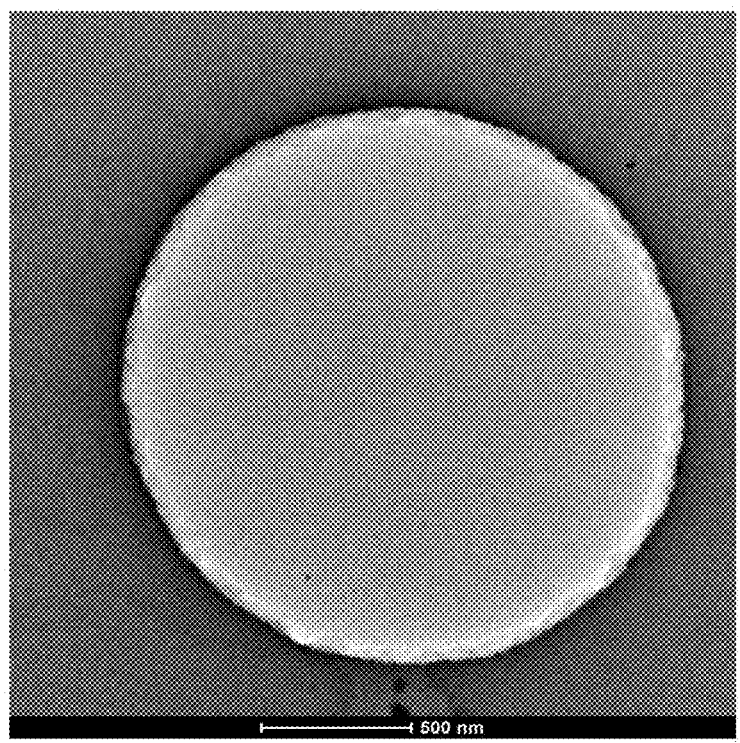
FIG. 10 shows a TEM image of a single-layer graphene after transfer according to one embodiment.

FIG. 10 shows a Transmission Electron Microscope (TEM) image of the graphene transferred on the surface of the porous silicon nitride substrate 101. Referring to FIG. 10, the single-layer graphene has no damage, and there is no residue on the surface of the single-layer graphene.

The method of preparing a TEM micro-grid provided in the present disclosure uses a carbon nanotube film structure to transfer a graphene layer to the surface of the porous silicon nitride substrate. The method comprises the following characteristics: firstly, no residual organic binders is left on the surface of the graphene layer; secondly, no wrinkles and cracks exists on the surface of the graphene layer, and the graphene layer has a high integrity; thirdly, the carbon nanotube film is light transmitting and transparent, and the graphene layer can be observed through the carbon nanotube film, therefore the graphene layer can be accurately transferred on a specific location of the surface of the porous silicon nitride substrate with precision under a stereo microscope.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A transmission electron microscope (TEM) micro-grid comprising:
    a porous silicon nitride substrate comprising a plurality of through holes;
    a graphene layer on a surface of the porous silicon nitride substrate and covering the plurality of through holes.

2. The TEM micro-grid of claim 1, wherein a thickness of the porous silicon nitride substrate ranges from 50 nanometers to 100 nanometers.

3. The TEM micro-grid of claim 1, wherein diameters of the plurality of through holes range from 0.1 micrometers to 100 micrometers.

4. The TEM micro-grid of claim 1, wherein the graphene layer is a continuous integrated structure.

5. The TEM micro-grid of claim 1, wherein the graphene layer comprises one to three layers of graphene.

6. The TEM micro-grid of claim 1, wherein the TEM micro-grid further comprises a supporting substrate, and the porous silicon nitride substrate is on a surface of the supporting substrate.

7. The TEM micro-grid of claim 6, wherein the supporting substrate comprises a window.

8. The TEM micro-grid of claim 7, wherein the plurality of through holes of the porous silicon nitride substrate is placed above the window of the silicon substrate.

9. The TEM micro-grid of claim 7, wherein a size of the window ranges from 20 micrometers to 100 micrometers.

10. A method for preparing a TEM micro-grid comprising:
    (S1) providing a first substrate with a graphene layer on a surface of the first substrate;

(S2) covering the graphene layer with a carbon nanotube film structure;

(S3) obtaining a composite structure comprising the graphene layer and the carbon nanotube film by removing the first substrate with a corrosion solution to;

(S4) cleaning the composite structure by placing the composite structure on a surface of a cleaning solution;

(S5) providing a porous silicon nitride substrate comprising at least one through hole, and picking up the composite structure from the cleaning solution with the porous silicon nitride substrate by contacting the porous silicon nitride substrate with the graphene layer of the composite structure and covering the at least one through hole with the graphene layer;

(S6) removing the carbon nanotube film structure from the composite structure.

11. The method of claim 10, wherein the carbon nanotube film structure is a free-standing structure, and the carbon nanotube film structure consists of at least two carbon nanotube films stacked with each other.

12. The method of claim 11, wherein each of the the carbon nanotube films comprises a plurality of carbon nanotubes joined end-to-end by van der Waals force therebetween and extending approximately along a same extending direction.

13. The method of claim 12, wherein an angle between the extending directions of the carbon nanotubes in different carbon nanotube films ranges from 0 degrees to 90 degrees.

14. The method of claim 10, wherein the step (S5) comprises: inserting the porous silicon nitride substrate into the cleaning solution; and lifting the porous silicon nitride substrate to pick up the composite structure.

15. The method of claim 10, wherein the step (S6) comprises:

placing a polymer film on a surface of the carbon nanotube film structure away from the porous silicon nitride substrate;

treating the polymer film by heating or by irradiation to increase a crosslinking degree of the polymer film; and tearing off the polymer film from the graphene layer.

16. The method of claim 15, wherein a material of the polymer film is a thermosetting material.

17. The method of claim 15, wherein the carbon nanotube film structure is covered by the polymer film.

18. The method of claim 10, wherein the carbon nanotube film structure consists of n-layer carbon nanotube films stacked with each other, wherein n is an integer greater than or equals to two.

19. The method of claim 18, wherein the step (S6) comprises:

tearing off a first layer carbon nanotube film to an n−1th layer carbon nanotube film of the carbon nanotube film structure sequentially along an extending direction of the carbon nanotubes of the carbon nanotube film, wherein the first layer carbon nanotube film is farthest away from the graphene layer;

placing at least one strip on a surface of an nth layer carbon nanotube film away from the graphene layer, wherein the strip is placed at one side of the nth layer carbon nanotube film, the strip does not cover the graphene layer, and an extending direction of the strip is substantially perpendicular to the extending direction of the carbon nanotubes of the nth layer carbon nanotube film; and tearing off the nth layer nanotube film from the graphene layer as the strip is being torn off along the extending directions of carbon nanotubes of the nth layer carbon nanotube film.

20. The method of claim 19, wherein the strip is a polymer film or an adhesive tape.

\* \* \* \* \*